(12) United States Patent
Lefevre et al.

US012191995B2

(10) Patent No.: US 12,191,995 B2
(45) Date of Patent: Jan. 7, 2025

(54) ONE-DIMENSIONAL HARD-INPUT FEC RECEIVER FOR DIGITAL COMMUNICATION

(71) Applicant: Nokia Solutions and Networks Oy, Espoo (FI)

(72) Inventors: Yannick Lefevre, Heverlee (BE); Amitkumar Mahadevan, Edison, NJ (US); Michiel Verplaetse, Nazareth (BE)

(*) Notice: Subject to any disclaimer, the term of this patent is extended or adjusted under 35 U.S.C. 154(b) by 134 days.

(21) Appl. No.: 17/861,140

(22) Filed: Jul. 8, 2022

(65) Prior Publication Data

US 2024/0014930 A1 Jan. 11, 2024

(51) Int. Cl.
  *H04L 1/00* (2006.01)
  *H04B 10/27* (2013.01)

(52) U.S. Cl.
  CPC .......... *H04L 1/0054* (2013.01); *H04B 10/27* (2013.01); *H04L 1/0061* (2013.01)

(58) Field of Classification Search
  CPC ............................ H04L 1/0054; H04B 10/541
  See application file for complete search history.

(56) References Cited

U.S. PATENT DOCUMENTS

| 10,027,423 | B1* | 7/2018 | Morero | H04L 25/067 |
| 2014/0079394 | A1* | 3/2014 | Xie | H04B 10/532 |
| | | | | 398/184 |
| 2022/0006532 | A1* | 1/2022 | Elzanaty | H04B 10/503 |
| 2022/0263691 | A1* | 8/2022 | Furtek | H04L 25/067 |
| 2023/0208542 | A1* | 6/2023 | Krampl | H04J 3/0605 |
| | | | | 398/43 |

FOREIGN PATENT DOCUMENTS

EP     3 113 436     1/2017

OTHER PUBLICATIONS

Voloshynovskiy et al., "Information—Theoretic Data—Hiding: Recent Achievements And Open Problems", International Journal of Image and Graphics, vol. 5, No. 1, 2005 (Year: 2005).*
Song et al., "A Normalized LLR Soft Information Demapping Method in DTMB System", IEEE, 2008 (Year: 2008).*
Hyun, K. et al., "Bit Metric Generation for Gray Coded Qam Signals", IEEE Proceedings: Communications, Institution of Electrical Engineers, vol. 152, No. 6, Dec. 9, 2005, pp. 1134-1138.
Kang, In-Woong et al., "Low-Complexity LLR Calculation for Gray-Coded PAM Modulation", IEEE Communications Letters, vol. 20, No. 4, Apr. 1, 2016, pp. 688-691.
Zhao, Xue et al., "LDPC-Coded Probabilistic Shaping PAM8 Employing a Novel Bit-Weighted Distribution Matching in WDM-PON", Journal of Lightwave Technology, vol. 38, No. 17, Sep. 1, 2020, pp. 4641-4647.

* cited by examiner

*Primary Examiner* — Shi K Li
(74) *Attorney, Agent, or Firm* — Capitol Patent & Trademark Law Firm, PLLC

(57) ABSTRACT

A digital receiver based on one-dimensional hard demapping of an input symbol stream (FEC encoded) is configured to utilize LLRs created to have bit-specific magnitude values to improve the probability that the included decoder (such as an LDPC decoder) properly recovers each bit from the original stream. The digital receiver may be used with various types of data modulation schemes (e.g., PAM3, PAM4, DSQ8, etc.), with a specific set of LLR magnitudes created for each modulation scheme.

18 Claims, 11 Drawing Sheets

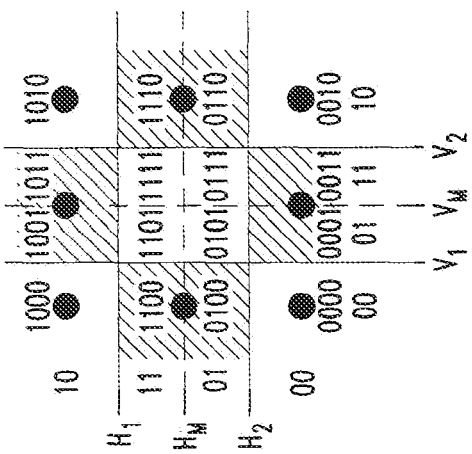
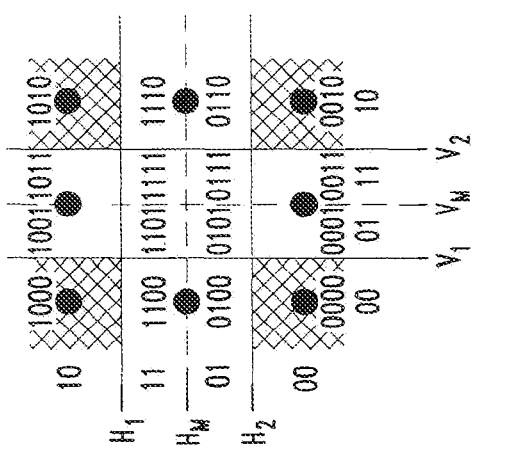
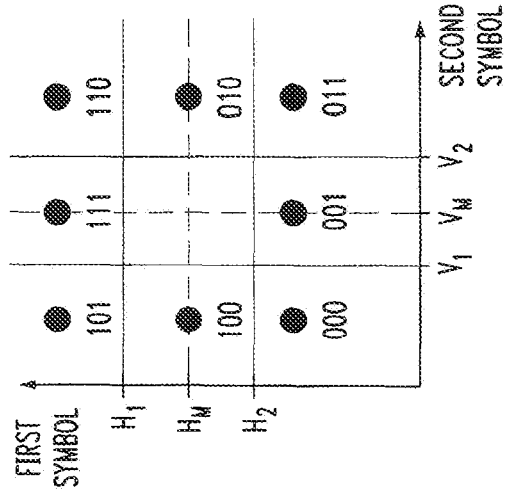

ONE-DIMENSIONAL HARD-INPUT FEC RECEIVER FOR DIGITAL COMMUNICATION

TECHNICAL FIELD

Disclosed herein are various embodiments of a digital receiver that is configured to recover data encoded within forward error correcting (FEC) code-based transmissions.

BACKGROUND

Next-generation passive optical networks (PONs) are considered as a viable option in the formation of high-speed, broadband access networks. PONs are based upon a point-to-multipoint (P2MP) topology, in which one optical line terminal (OLT) at the network side is used to communicate with a multitude of individual optical network units (ONUs) by means of an optical distribution network (ODN) or fiber plant. The ODN contains optical fibers and splitters (forming a tree and branch topology), but no active optical components. Most PON technologies are time-division multiplexing (TDM) based, where the fiber medium is shared in time between the various ONUs. PON systems may also use both time-division and wavelength-division multiplexing (TWDM), in which multiple TDM arrangements, each operating at a different wavelength, are stacked onto a common fiber plant. FIG. 1 is a basic illustration of a typical PON system, where individual optical receivers at each ONU may necessarily require the ability to work with forward error correcting (FEC) codes in order to properly reconstruct high transmission rate data from the OLT. In some cases, the optical receiver(s) within the OLT may likewise need to utilize FEC codes to properly handle upstream burst transmissions from the individual ONUs.

A recent standard published by the ITU (i.e., PON G.9804) specifies the use of 50G transmission in the downstream direction (from the OLT to the ONUs) and either 12.5G or 25G in the upstream direction. In this standard, as in previous PON-related standards, a single forward error correction (FEC) code is used for all of the ONUs within the PON system (with the option to turn "off" the use of the FEC code in the upstream direction for individual ONUs, as desired). For the G.9804 standard, the FEC code takes the form of a binary low density parity check (LDPC) code with 57*256=14592 information bits and 10.5*256=2688 parity bits, yielding a total codeword length of 17280 bits.

To further increase the data rate of G.9804 systems, it has been proposed to use a "flexible" type of PON system; that is, a PON system that is capable of supporting two or more different modulation formats. For example, a conventional 50G NRZ transmission may be combined with 50G PAM4 transmission, with the PAM4 transmission identified for use by ONUs with signal channels that exhibit higher quality channel characteristics with respect to other ONUs. That is, ONUs may be grouped based on their channel characteristics, with PAM4-based data sent to the high-performance ONUs and 50G NRZ used by others. In this way, 100G PAM4 operation is enabled. In multi-rate PON systems, it is important that the optical receivers are configured to recover the transmitted data within the defined error rate criteria, which may lead to use of expensive and complex circuitry within the receivers.

To this point, FIG. 2 shows a possible difference in required optical power margin for a different modulation scheme (here, for example, PAM4) with respect to NRZ with the LDPC code of the G.9804 standard. In this case, the "margin" refers to the difference between the required signal power for a given performance level and the required signal power to meet the same performance level for NRZ with the LDPC code of the G.9804 standard.

One conventional PAM4 receiver is based on soft-input LDPC decoding, which requires the use of an A/D converter (ADC) to sample the received analog signal. The sample values are then demapped (and perhaps passing through an equalizer prior to demapping) using a soft demapper into log-likelihood ratios (LLRs). In particular, for each transmitted bit $b_n$, an $LLR_n$ is calculated based on the received samples y using the following:

$$LLR_n = \log\left(\frac{P(b_n = 0|y)}{P(b_n = 1|y)}\right).$$

These LLRs are often approximated, in many cases assuming an additive white Gaussian noise (AWGN) channel. Alternatively, the LLRs may be approximated based on measured histograms associated with the particular communication channel; other criteria may be used as well. The PAM4 receiver includes an LDPC decoder, where the LLRs are supplied as the input and the decoder provides as an output the FEC-corrected bits. While this soft-input receiver achieves an optimal level performance, it comes at the cost of a large complexity in terms of requiring an ADC and a high-speed interface between the soft demapper and the LDPC decoder. For example, presuming the use of five bits of resolution to carry the information for the LLR of one transmitted bit, this results in the need for a 500 Gb/s interface for 100 Gb/s transmission.

An alternative PAM4 receiver may be implemented using a hard-input LDPC decoder, which eliminates the need for an ADC if equalization is not required. A slicer-based hard demapper is used in the PAM4 receiver structure to convert the incoming analog signal directly into a representative bit stream. That is, the slicer outputs a stream of bits $b_n$ that are denoted as either "logic 0" or "logic 1", based on the received symbols. The bits are then converted to input LLR values for the LDPC decoder, where the LLR values exhibit a fixed magnitude with the sign determined by the bit value (basically, the bits are treated as coming from a binary symmetric channel). That is, $LLR_n = -1^{b_n} LLR_{init}$. While exhibiting a performance degradation compared to the soft input type of receiver, the structure is less complicated and only requires a 100 Gb/s interface between the demapper and decoder for 100 Gb/s transmission.

As mentioned above, PAM3 transmission may be included in a multi-rate PON system to somewhat close the gap in sensitivity between PAM4 and NRZ rates. A practical way to generate and receive PAM3 data uses a two-dimensional constellation, particularly a 3×3 grid that delineates eight separate points that can be indexed by using three bits, resulting in 3/2=1.5 bits transmitted per symbol. The need to use a two-dimensional constellation thus requires the use of 2-dimensional demapping. That is, the samples of two received symbols have to be taken into account to recover the three individual bits encoded by the pair of symbols. The additional complexity associated with required processing of pairs of symbols is also problematic, since the required processing is different from sample to sample (i.e., the odd samples require a different processing than the even samples). The optimal decision boundaries (i.e., the boundaries leading to minimal bit errors) cannot be realized using simple one-dimensional slices; instead, a combination of one-dimensional slicers (in the form of horizontal and vertical lines) and two-dimensional slicers (in the form of diagonal lines) are required.

In light of the above, a remaining problem for consideration is how to improve the performance of a digital receiver when receiving FEC-encoded data without requiring complex modifications to either the initial symbol demapping process or the subsequent decoding of demapped bits into recovered data.

SUMMARY OF THE DISCLOSURE

The needs remaining in the prior art are addressed by the utilization of a digital receiver that employs a combination of a one-dimensional, hard-input demapper with an LDPC decoder to recover FEC-encoded data, where the digital receiver is further configured to include an LLR generator that uses supplemental information associated with the demapped bits to assign specific LLR magnitudes to the LLR values provided as inputs to the LDPC decoder, the different magnitudes related to probability of error in a demapped bit. The use of different LLR magnitudes is considered to improve the performance of the receiver (for example, in terms of BER after FEC decoding) at a negligible increase in component complexity.

In accordance with an exemplary embodiment of the present invention, it is contemplated that the LLR generator may take the form of a component that is internal to the LDPC decoder. In one implementation, the generator may be used at the beginning of the decoding process to initialize LLR values (including magnitude), which are then iteratively improved during the decoding process. In another embodiment, the same set of initial LLR values may be used with each decoding iteration.

An exemplary embodiment may take the form of a digital receiver for recovering data from a FEC-encoded signal having a stream of N bits mapped into M transmitted symbols. In this embodiment, the digital receiver comprises a one-dimensional hard demapper for generating a set of K demapped bits for each arriving symbol (K=ceil(N/M)) and a FEC decoder for producing a stream of decoded data bits from the output of the one-dimensional hard demapper. The FEC decoder itself including an apparatus (responsive to a set of M*K demapped bits) that is configured to convert the set of M*K demapped bits into a plurality of N log-likelihood ratios (LLRs) associated with the stream of N bits in a one-to-one relationship. The apparatus comprising at least one processor, and at least one memory including computer program code, wherein the at least one memory and the computer program code are configured, with the at least one processor, to cause the apparatus to generate the plurality of N LLRs, each LLR defined by a magnitude and a sign, the magnitude selected from a plurality of predefined, different LLR magnitudes. The FEC decoder also including a decoding engine responsive to the LLRs generated by the apparatus and producing therefrom an output stream of decoded data bits.

While selected embodiments may be described below in terms of an optical receiver as used within a passive optical network (PON), it is to be understood that the inventive concepts are equally applicable to any type of communication channel, e.g., wireline, wireless or optical, and employing electrical-based receiver configurations as well as optical-based receiver configurations.

Other and further embodiments and aspects of the disclosed receiver configuration will become apparent during the course of the following discussion and by reference to the accompanying drawings.

BRIEF DESCRIPTION OF THE DRAWINGS

Referring now to the drawings,

FIG. 3(a) illustrates the distributions of received samples (presuming AWGN channels), FIG. 3(b) illustrates the error probability of the MSB (in the distributions of FIG. 3(a)) in the case of a transmitted logic "0", and FIG. 3(c) illustrates the error probability of the LSB;

DETAILED DESCRIPTION

Figure 1:
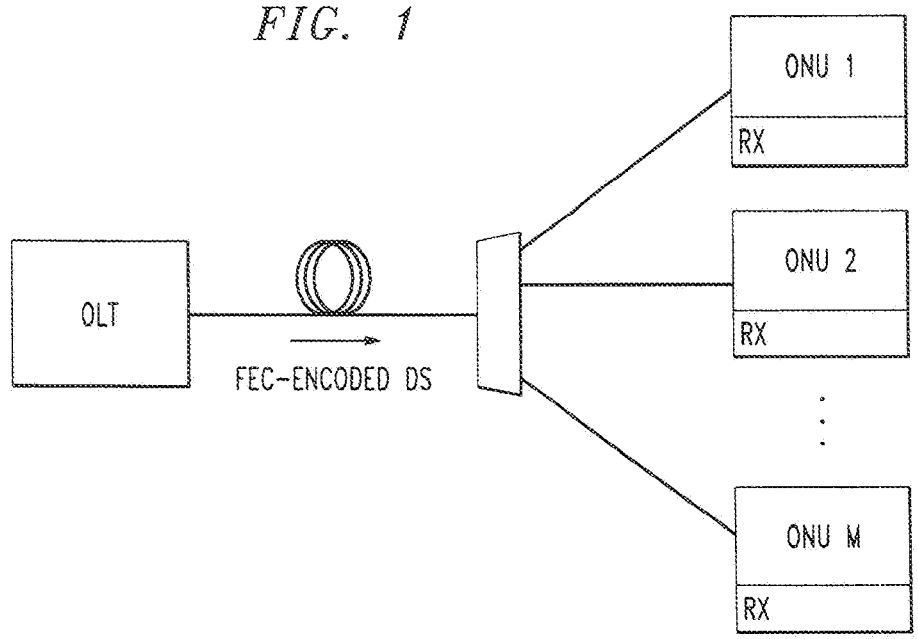
FIG. 1 is a simplified depiction of a typical passive optical network (PON) that may utilize optical receivers as configured in accordance with the principles of the present invention.
Figure 2:
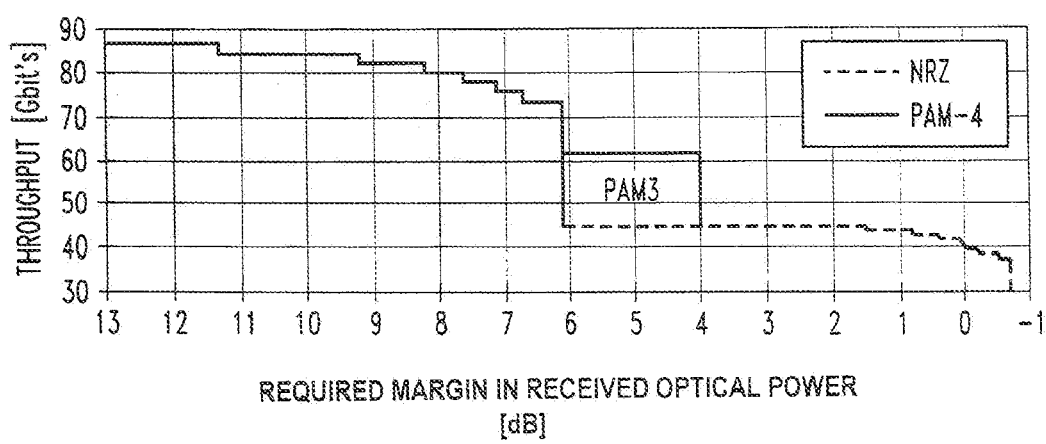
FIG. 2 is a graph comparing throughput (Gbit/s) for PAM4, PAM3, and NRZ modulation formats as a function of the margin in received optical power with respect to NRZ with the LDPC code of the G.9804 standard.

A recently published ITU standard (namely, G.9804) now defines an accepted level of downstream communication in a PON system as 50 Gbit/s per wavelength. With this increase in transmission speed, however, comes the need for optical receivers to recover the transmitted data where the characteristics of the communication channel itself (i.e., the passive ODN) may exhibit more of an influence on the quality of signal arriving at an ONU. For critical user data, the impact of transmission quality may be partly mitigated by employing advanced, improved forward error correction (FEC) techniques within the downstream transmission. For example, Low-Density Parity-Check (LDPC) codes are now considered a preferable FEC code that may be used to deliver both transmitted data and a mechanism to perform error recovery to the optical receiver. The LDPC code may be described as a block code, where k incoming bits are processed in one step and r redundancy bits are added to form a codeword of n=r+k bits.

As described above and discussed in detail below, the present invention is directed to a digital receiver design that is sufficiently robust to handle the use of FEC codes with various mapping schemes without the need to rely on advanced, complicated soft-input demapping techniques at the receiver (in either optical or electrical communication applications). In particular, a proposed receiver structure is formed to include an LLR generator apparatus that assigns specific LLR magnitude values based on demapped bits as a function of additional information that is known about these bits (in contrast to the conventional use of fixed-magnitude LLRs when using a hard-input FEC decoder).

The digital receiver utilizes a one-dimensional, hard demapper to create an initial set of bits from the received FEC-encoded symbols. Additional information in terms of the type of mapping that is employed (e.g., PAM4, PAM3, or generally any scheme where N bits are mapped into M symbols prior to transmission) is used by the LLR generator to determine/select a specific magnitude for each LLR that is created for each transmitted bit. As discussed below, a set of possible magnitudes may be developed a priori (as a function of the likelihoods that a received sample originates from the 0 and 1 values for the bit associated with the LLR), with different sets of magnitudes perhaps used for different transmission schemes (e.g., PAM4 vs. PAM3). The result is a set of more accurate LLRs (as compared to the prior art "fixed magnitude" type) to be used as the input to a conventional LDPC decoder.

Based on these higher-quality LLRs, it is contemplated that the decoded output data signal will exhibit an error rate that is lower than that associated with the utilization of fixed-magnitude LLRs. An aspect of the present invention is that disclosed technique may be used with either optical receivers or electrical receivers, and with wireline (fiber, coax cable) or wireless (free space optics, RF) communication channels.

Recall that the prior art PAM4 receiver described above that was based on the use of a one-dimensional demapper was limited to utilizing LLRs of fixed magnitude as the input to the LDPC decoder. In that case, only a difference in sign is used in the LLRs to distinguish between a recognized bit of logic 0 versus a recognized bit of logic 1. That is, for an individual bit $b_n$, $$LLR_n = -1^{b_n} LLR_{init},$$

where $LLR_{init}$ is a fixed magnitude value.

In contrast and in accordance with the principles of the present invention, it is proposed to use additional information present for each bit demapped from an incoming symbol to select an appropriate LLR magnitude that may improve the LDPC decoder's performance by supplying a higher quality set of LLR inputs to the decoder. It has been found that the use of multiple LLR magnitudes, and the ability to properly select an appropriate magnitude for each individual LLR applied as an input to the LDPC decoder improves the accuracy of the recovered data (e.g., lowers the BER after FEC decoding), where the selection of the appropriate LLR magnitude for a presented bit requires only a minimal increase in circuitry. That is, by using multiple LLR magnitudes, the individual LLR values can more accurately represent the log ratio of the likelihoods of the associated bits, improving the performance of the decoder.

The concepts involved in using multiple LLR magnitudes as part of an LDPC decoding scheme within a digital receiver are first described below in the context of decoding PAM4 data (which is characterized by mapping two data bits into each symbol). Following this, an arrangement providing multiple LLR magnitudes appropriate for use with PAM3 data will be described (PAM3 data being an example where a non-integer number of data bits are mapped per symbol, in this case 1.5 bits per symbol). Once these examples are fully explained and understood, a more generalized approach suitable for other integer-based or non-integer-based coding schemes will be described.

As well known in the art, PAM4 mapping is based upon the concept of mapping N=2 bits to M=1 symbol. At the receiver, therefore, a one-dimensional, hard demapper may be used to sample the incoming analog signal and generate an output of demapped bits in the form of K=2 bits per sample. FIG. 3(a) shows an example of the distribution of received PAM4 samples presuming an AWGN channel, where the channel characteristics result in each transmitted PAM4 level broadening into a Gaussian distribution at the receiver. Here, the set of PAM4 levels has been designated as −3, −1, +1, and +3 (other designations are known and used in the art) and each level is associated with a two-bit label, as shown, based on the Gray coding scheme. While either Gray coding or linear coding may be used, Gray coding is preferred since only one bit changes in value between adjacent symbols. The optimal hard decision boundaries (i.e., "slice" locations) between adjacent levels are shown by the vertical lines B in FIG. 3(a) and are located at a mid-point between two neighboring levels.

FIG. 3(b) depicts the same set of received PAM4 levels as shown in FIG. 3(a), but in this case identifies only the most-significant-bit (MSB) associated with each level. With the application of Gray mapping and its single-bit transition feature, the MSB thus exhibits only a single change in value (i.e., between the −1 and +1 levels). Therefore, any error in mis-identifying the MSB as a logic "1" instead of a transmitted logic "0" (or vice versa) corresponds to the error region denoted $p_M$ in FIG. 3(b).

FIG. 3(c) again illustrates the same PAM4 levels, but in this case shows the least-significant-bit (LSB) error that may associated with this same Gray code mapping. Inasmuch as the LSB changes twice across the set of levels (i.e., between −3 and −1, and again between +1 and +3), the error probability is approximately twice as high, shown as regions $p_{L1}$ and $p_{L2}$ in FIG. 3(c).

This difference in error probability between the MSB and LSB of the K=2 bits in the demapped PAM4 input symbol is taken into consideration in accordance with the principles of the present invention to more accurately define the individual LLRs associated with these bits as part of the data recovery process within the digital receiver's LDPC decoder. That is, inasmuch as the reliability of the MSB decoding decision is higher than that of the LSB decoding decision, this difference in probability can be taken into account during the LDPC decoding process. Said another way, the LLRs of the MSBs and LSBs are initialized with different magnitudes as a function of their different error probabilities, providing bit-dependent LLRs as the input to the associated LDPC decoder. It is to be understood that the use of MSB and LSB as elements for determining LLR magnitude are only one example. Other properties of a particular modulation format, or known properties of a communication channel, may be used to develop a set of magnitudes for use in creating high-quality LLR values for a particular digital receiver arrangement. For example, the LLR magnitude may be derived based on an AWGN channel model, or measured histograms, as mentioned previously.

Figure 3:
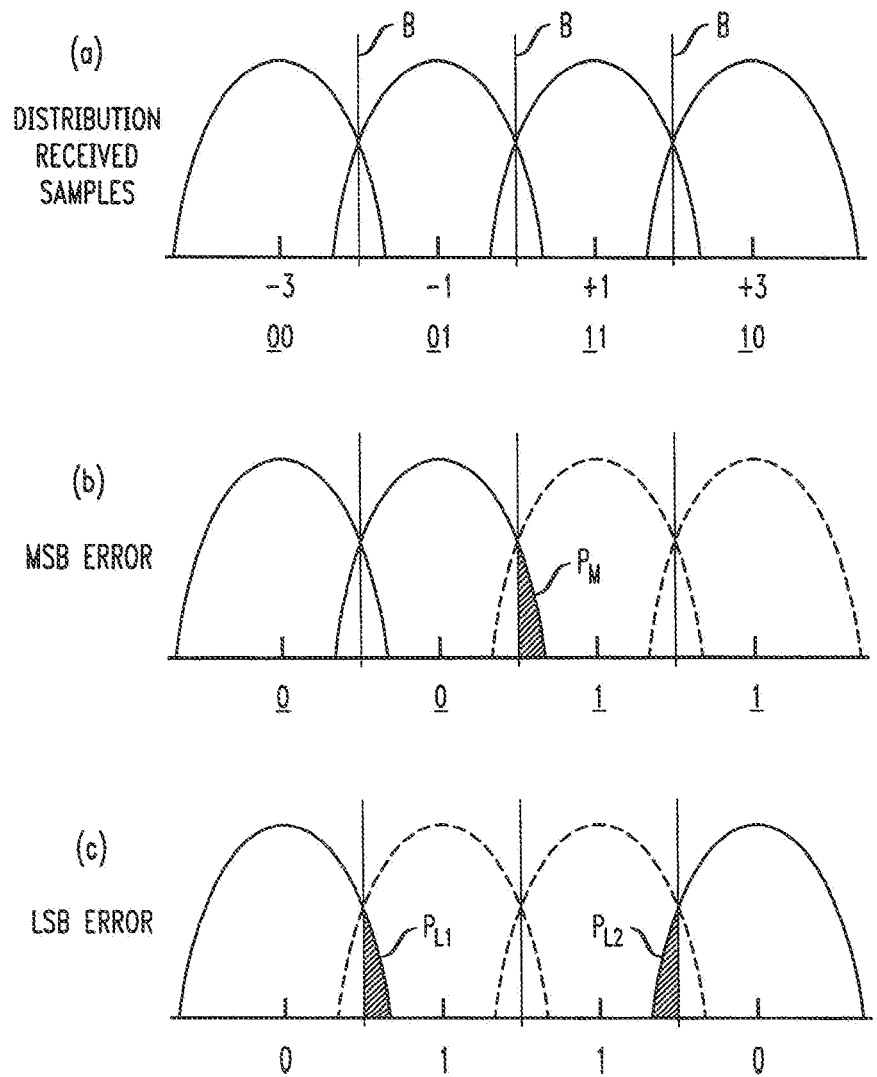
FIG. 3 illustrates the process of demapping a PAM4-encoded signal, where
Figure 4:
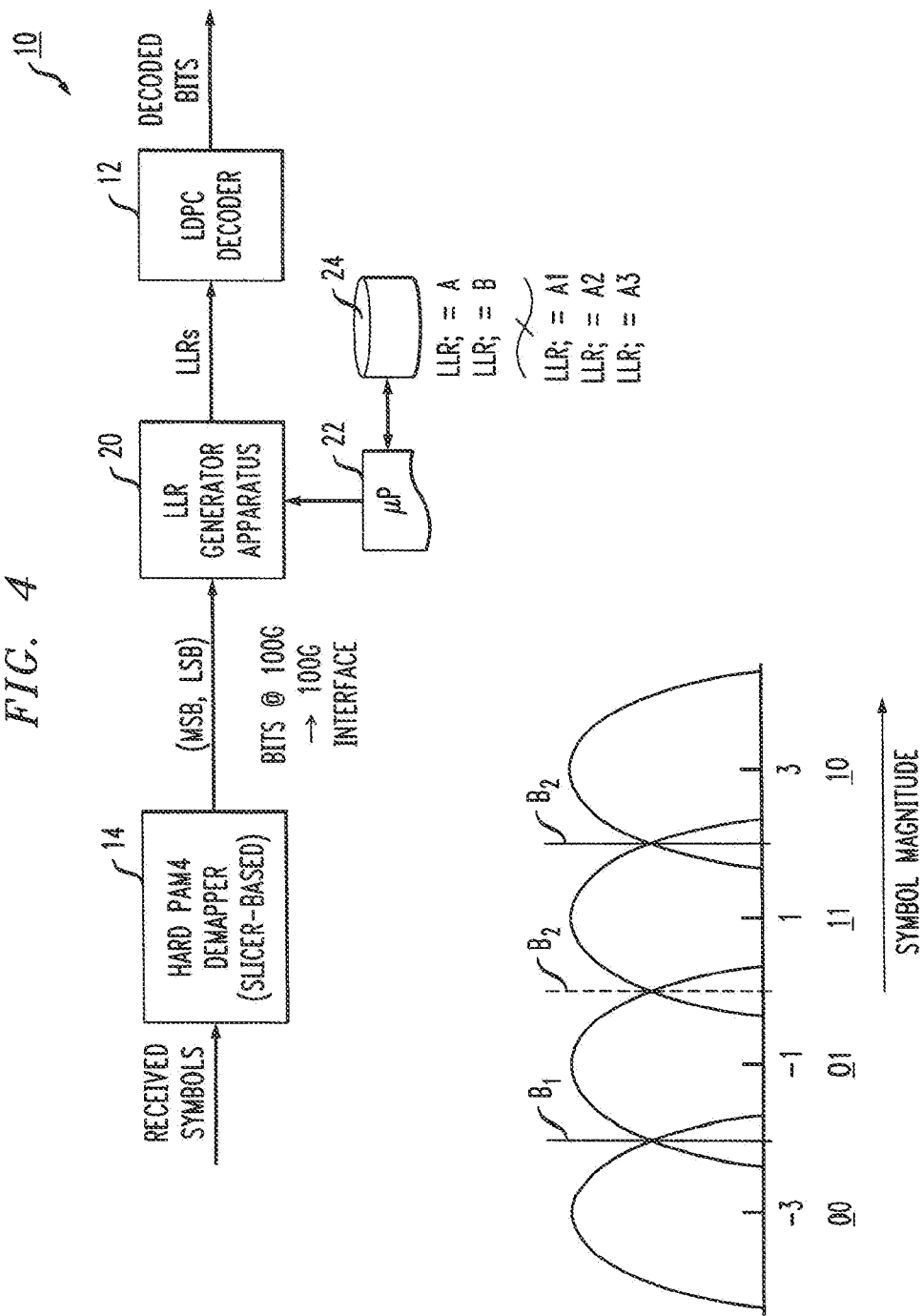
FIG. 4 illustrates an exemplary PAM4 digital receiver formed in accordance with the present disclosure to generates LLRs of different magnitudes, based upon identification as MSB or LSB in demapped bits, using an LLR generator apparatus to select a proper, predefined LLR magnitude.

FIG. 4 illustrates an exemplary PAM4 digital receiver 10 formed in accordance with the principles of the present invention to utilize these bit-dependent LLRs as the input to an included LDPC decoder 12. Digital receiver 10 is based upon the use of a one-dimensional hard demapper 14, which uses the boundaries B shown in FIG. 3 above to make determinations about where to "slice" received symbols, providing two-bit outputs (MSB, LSB) for each received symbol (in the following, an individual bit may be denoted by the letter "b"). Following this demapping operation, the (MSB, LSB) pair is provided as an input to an LLR generator apparatus 20 that is used in accordance with the principles of the present invention to convert the individual bits into appropriate LLR values.

As shown in FIG. 4, apparatus 20 includes at least one processor 22 and at least one memory 24 including computer program code. Also stored in memory 24 is a set of predefined (a priori) LLR magnitudes, which are derived from an understanding of the particular modulation format(s) that may be used, as well as communication channel conditions (e.g., AGWN-based channels, measured histograms, SNR, etc.). A particular LLR magnitude is selected by processor 22 to be used in the formation of an LLR for each bit received by apparatus 20. In particular for this PAM4 digital receiver example, memory 24 and its associated computer program code are configured with processor 22 to cause LLR generator apparatus 20 to first determine if a currently-received bit $b_n$ is either an MSB or LSB. If the presented bit is identified as an MSB, a first LLR stored magnitude (for example, $|A|$) is retrieved from memory 24 and assigned to the received bit. Otherwise, if the presented bit is identified as an LSB, memory 24 assigns a second stored LLR magnitude (for example, $|B|$, where A>B). The sign of the generated LLR follows the same convention as the prior art, using the relation $-1^{b_n}$.

Summarizing, LLR generator apparatus 20 is caused to perform the following decisions:

if $b_n$ is $MSB, |LLR_{init}|=|A| \Rightarrow LLR_n=-1^{b_n}|A|$;

if $b_n$ is $LSB, |LLR_{init}|=|B| \Rightarrow LLR_n=-1^{b_n}|B|$, using the combination of at least one processor 22 and at least one memory 24. Thus, each bit is converted into an appropriate LLR, depending on whether it was an MSB input or an LSB input, where in the case of PAM4 mapping the magnitude of the MSB LLR is set to a larger value than the magnitude of the LSB LLR. The output from LLR generator apparatus 20 is a pair of LLRs (associated with the MSB, LSB pair), which are thereafter applied as the initial LLR values to conventional LDPC decoder 12.

Figure 5:
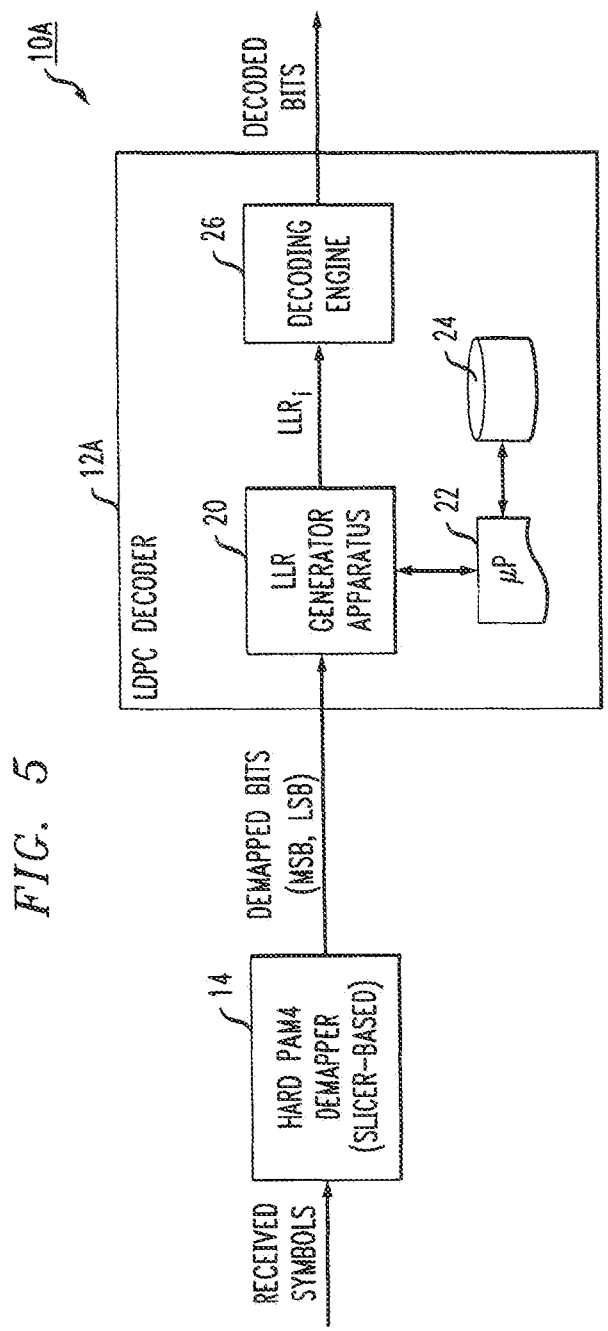
FIG. 5 is an alternative embodiment of a PAM4 digital receiver, in this case where the LLR generator apparatus is confirmed as an element of the LDPC decoder itself.

In contrast to use with a conventional LDPC decoder, another embodiment of the present invention may take the form of a specialized LDPC decoder specifically configured to include the inventive LLR generation functionality. FIG. 5 illustrates an exemplary PAM4 digital receiver 10A, where the demapped bits formed by one-dimensional hard demapper 14 are provided as an input to LDPC decoder 12A. The initial operation within decoder 12A is the creation of initial LLR values by an LLR generator apparatus 20, which then provides the initially-generated LLR values to a decoding engine 26 that proceeds with the actual LDPC decoding process. In this case, LLR generator apparatus 20 is required to generate only an initial set of LLR values. During the decoding process itself, these initial LLR values are likely to evolve and change as the decoding process progresses. Decoding engine 26 is configured in this particular embodiment to also create updated LLR values during each iteration through the decoding process.

Figure 6:
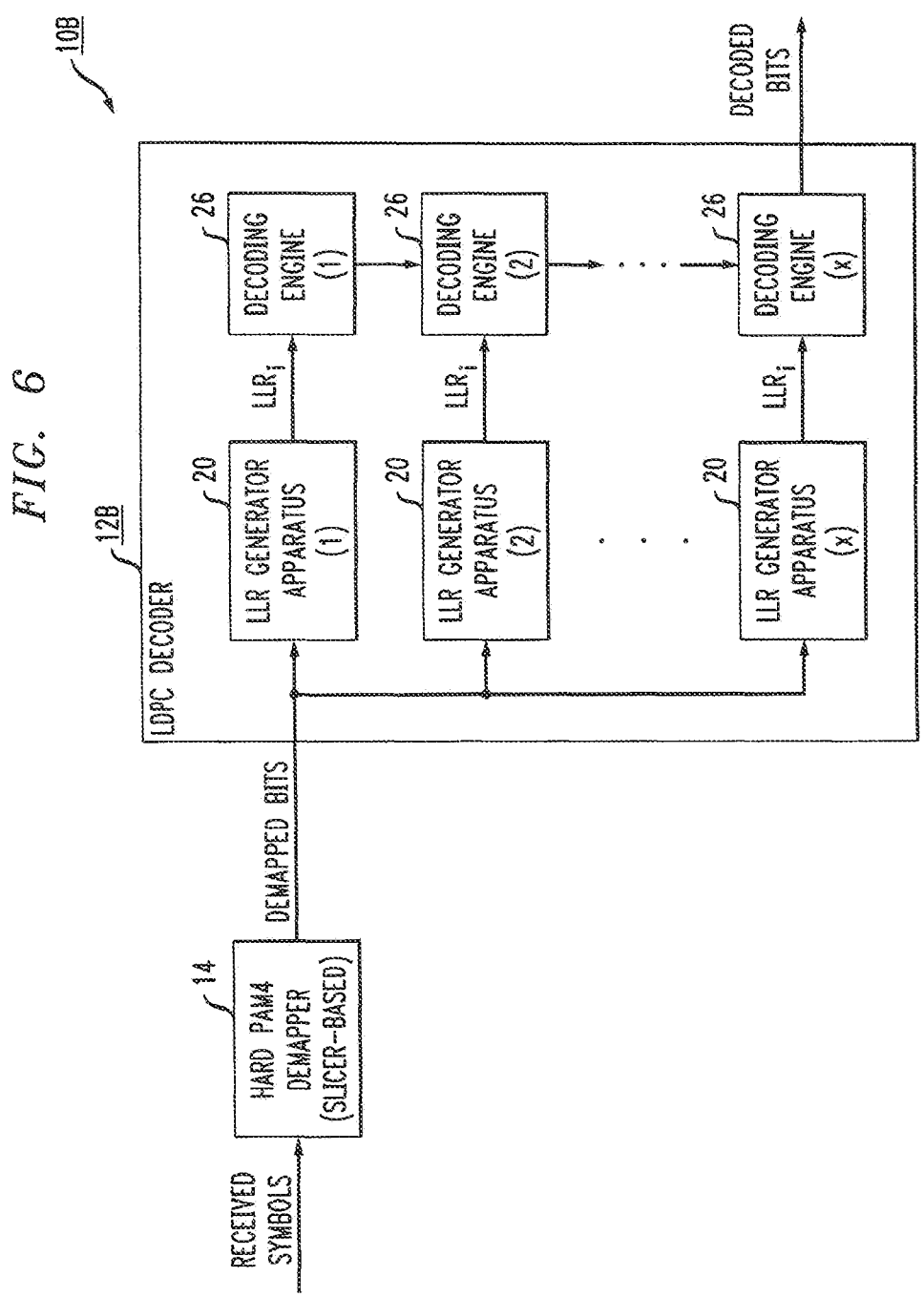
FIG. 6 is a particular configurations of the alternative embodiment of FIG. 5, where in this case, the LDPC decoding engine generates the same initial LLR values for use in each iteration of the decoding process.

An alternative to the configuration of FIG. 5 is illustrated is FIG. 6. In this arrangement, denoted as digital receiver 10B, LLR generator 20 is configured to provide the same initial LLR values to decoding engine 26 for each iteration of the decoding process. In this illustration, the designations (1), (2), . . . , (x) are used to define each instantiation of decoding engine 26, with the first iteration shown as decoding engine 26(1), and the final iteration shown as decoding engine 26(x).

It is to be understood that the details of the specific LDPC decoding process are not germane to the subject matter of the present invention; rather, the inventive principles are related to the improvement of the decoder's performance by creating a more accurate set of LLR magnitude values from which may be selected specific, individual magnitudes for each LLR, the result being a more accurate set of input LLR values for use by the LDPC decoder. That is, by virtue of having a selection of magnitude values for the LLRs, as created by LLR generator apparatus 20, the quality of the recovered data is improved with a minimal increase in complexity.

Figure 7:
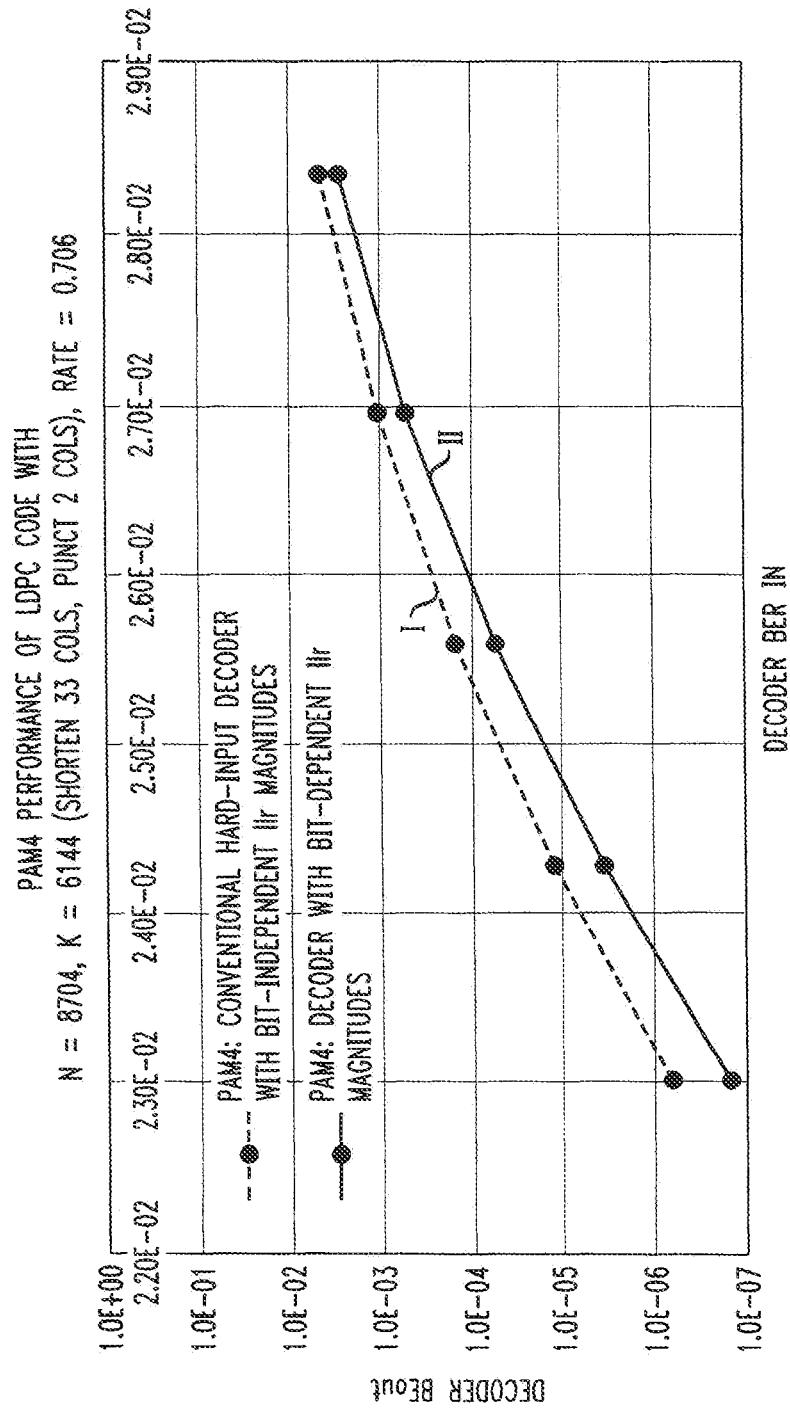
FIG. 7 is a graph depicting improvements in LDPC decoding for PAM4 in accordance with this disclosure, where the MSBs and LSBs are assigned LLRs of different magnitudes.

FIG. 7 is a graph illustrating a possible improvement in the performance of LDPC decoder 12 when using a higher magnitude LLR for the MSBs in accordance with the inventive principles. In particular, the graph of FIG. 7 contains two plots to illustrate this improvement, where plot I includes data associated with a prior art configuration that uses the fixed-magnitude LLRs for both MSB and LSB, and plot II includes data for the system as shown in FIG. 4 using different LLR magnitudes for MSB and LSB. The plots show the LDPC output BER as a function of the input BER, in this case associated with PAM4 performance of an LDPC code with N=8704, K=6144, and a rate=0.706.

In further accordance with the principles of the present invention, an additional level of LLR magnitude assignment accuracy may be obtained in this PAM4 modulation scheme example by also taking into consideration the fact that the reliability of the MSB is additionally dependent on the specific received PAM4 level. This aspect can be understood by referring again to FIG. 3, where for example if the received symbol is one of the "outer" levels (i.e., either 00 or 10), the probability of having an error on the MSB is much lower than when receiving an "inner" level (01 or 11). In this case, LLR generator apparatus 20 of digital receiver 10 can be further configured to assign a particular LLR magnitude to the incoming MSB as a function of its associated LSB value. That is, the MSB LLR magnitude can be set to a first, higher value when the associated LSB=0, or set to a second, lower value when the associated LSB=1.

In this further embodiment, LLR generator apparatus 20 is caused by included at least one processor 22 and at least one memory (including computer program code) to perform the following decisions:

if $b_n$ is MSB and LSB=0,|$LLR_{init}$|=|$A1$|, and $LLR_n$=−$1^{b_n}$|$A1$|;

if $b_n$ is MSB and LSB=1,|$LLR_{init}$|=|$A2$|, and $LLR_n$=−$1^{b_n}$|$A2$|; and if $bn$ is LSB, |$LLR_{init}$|=|$A3$|, and $LLR_n$=−$1^{b_n}$|$A3$|, where $A1>A2>A3$.

Figure 8:
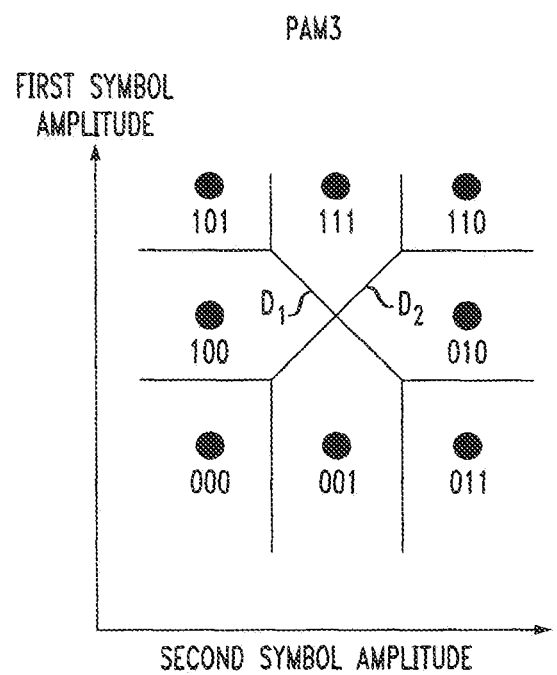
FIG. 8 illustrates a typical two-dimensional constellation diagram associated with mapping PAM3 data, where a set of N=3 data bits is mapped into a pair of symbols (i.e., M=2 symbols)

These basic inventive principles as embodied within the configuration of a PAM4 receiver are now applied to the specific example of recovering PAM3-mapped data. In the case of PAM3, N=3 bits are transmitted per M=2 symbols. FIG. 8 illustrates a conventional two-dimensional constellation diagram that may be used to understand the PAM3 mapping methodology. Here, the levels of a first received symbol are plotted in the y-axis direction and the levels of a second received symbol are plotted in the x-axis direction. It is noted that a central region of the constellation does not contain any constellation points. Thus, when received samples have values that lie within this region, it is unclear from which transmitted PAM3 constellation point they originated. Thus, in the prior art, two-dimensional decision boundaries, as noted by the diagonal lines D1, D2 in FIG. 8 are required to best determine the constellation point associated with the received symbols. An aspect of the use of multiple LLR magnitudes allows for this uncertainty to be taken into consideration when generating an optimum set of LLRs for use by the decoder.

As mentioned above, one premise of the inventive receiver is to maintain a relatively uncomplicated receiver arrangement by using a one-dimensional, hard demapper to process the incoming symbols. For the case of non-integer based mapping (of which PAM3 is one example), a one-dimensional hard demapper is required to demap to K=ceil (N/M) bits. In this case of PAM3, where N=3 and M=2, K=ceil(3/2) bits, or K=2 bits. Thus, similar to the PAM4 configurations described above, a one-dimensional hard demapper used with both symbols of the PAM3 data also provides an output of two bits per symbol. As a result, a similar set of boundary (slicer) levels may be applied to the incoming PAM3 symbols, generating as an output pairs of bits. For the case of PAM3, however, a total of four bits (i.e., two consecutive pairs of bits) are needed to perform the LLR generation in accordance with the teachings of the present invention, as described in detail below.

The PAM3 LLR generation process thus begins by collecting the demapped bits for an associated pair of symbols. Using the above discussion, each symbol (represented by each dimension in the diagram of FIG. 8) is first demapped by using a one-dimensional hard demapper. FIG. 9(a) illustrates the application of the one-dimensional demapping of PAM4 (as shown in FIG. 3) to this two-dimensional constellation. As shown, a set of three boundary levels (decision thresholds) is identified for each dimension, allowing for the application of a similar one-dimensional demapping process as used with PAM4 to be applied to each of the symbols used to form a PAM3 constellation point. For explanatory purposes, the dimensions are identified as "horizontal" (H) and "vertical" (V). Here, a pair of outer boundaries are placed on the two optimal PAM3 decision boundaries in each dimension. This set of four boundaries is shown as $H_1$, $H_2$, $V_1$, and $V_2$ in FIG. 9(a). A middle boundary is also included along each dimension (shown as $H_M$ and $V_M$) and corresponds to the center PAM3 level.

The LLRs are determined by considering a demapped region (e.g., 00 00), and considering what is the most likely constellation point from which any samples in this demapped region originate. For the specific outer regions where received samples are uniquely associated with constellation points (shown as shaded in FIG. 9(b) and discussed below with respect to Table I), as well as the regions where one received symbol has a unique association (shown as shaded in FIG. 9(c); also see Table II), the result of the consideration is clear and the received samples most likely originate from the corresponding transmitted constellation point. In contrast, when the received samples lie within the central region, it is unclear from which constellation point the samples most likely originate. A methodology for assigning LLR magnitudes for samples associated with this central region will be described below in association with FIGS. 9(d) and (e).

In order to appreciate the capability of using one-dimensional demapping with the presented PAM3 constellation points, FIG. 9(b) contains identifications to show the mapping between the PAM4 levels and each symbol in the PAM3 two-dimensional constellation. A first conclusion from this illustration is that four corner constellation points (shaded in FIG. 9(b)) are uniquely associated with only one pair of symbols. The following Table I shows this mapping:

TABLE I

| FIRST SYMBOL | SECOND SYMBOL | CONSTELLATION POINT | LLR MAGNITUDE |
|---|---|---|---|
| 00 | 00 | 000 | ALL HIGH |
| 10 | 00 | 101 | ALL HIGH |
| 00 | 10 | 011 | ALL HIGH |
| 10 | 10 | 110 | ALL HIGH |

The notation of the "LLR magnitude" as "all high" is used to note that all three LLRs that will be generated for the triplet of values applied as inputs to the following LDPC decoder will be assigned the highest magnitude value.

Also evident from the arrangement in FIG. 9(c) is that when only one symbol is associated with one of the corner values (i.e., "00" or "10"), the associated PAM3 constellation point can lead to received symbols with likely two possible values of the other symbol. This aspect is shown in the constellation diagram of FIG. 9(c), where a set of four "side" regions are shown as meeting this "one point, two value" correspondence. Thus, when receiving samples in these regions, there is also a unique constellation point from which these samples likely originate, and LLR magnitudes with a high value can be used. Table II, below, captures this information in the following manner:

TABLE II

| FIRST SYMBOL | SECOND SYMBOL | CONSTELLATION POINT | LLR MAGNITUDE |
|---|---|---|---|
| 01 | 00 | 100 | HIGH |
| 11 | 00 |  | HIGH |
| 01 | 10 | 010 | HIGH |
| 11 | 10 |  | HIGH |
| 00 | 01 | 001 | HIGH |
| 00 | 11 |  | HIGH |
| 10 | 01 | 111 | HIGH |
| 10 | 11 |  | HIGH |

Figure 9D:
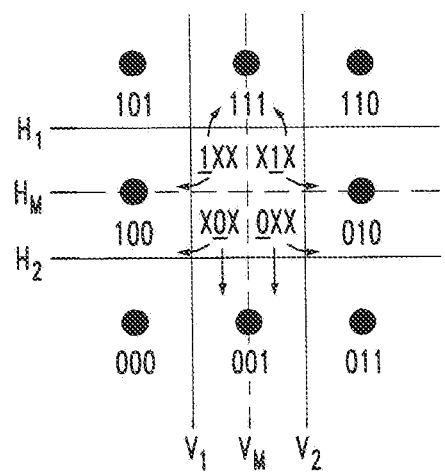
FIG. 9(d) illustrates a first possible mapping of an undefined area of the PAM constellation into defined points, and FIG. 9(e) illustrating a second possible mapping of the undefined area.

Recall that the mid-level boundaries $H_M$, $V_M$ are used in accordance with the inventive principles to provide an indication of the constellation points to be associated with symbol levels occupying the central region of the constellation map. This is depicted in FIG. 9(d), which shows that for each of the four sub-regions delineated by boundaries $H_M$ and $V_M$, there is one individual bit that can be known with a high reliability by comparison with its two nearest neighboring constellation points, indicated by the arrows in FIG. 9(d). That is, for each of the four identified central regions, there is one bit that has the same value as two neighboring constellation points. The other two bits cannot be readily determined in this manner, and are therefore shown by "X" in FIG. 9(d). Given this combination of "known" and "unknown" values, the LLR generator apparatus of the present invention will function to assign individual magnitudes to each bit the triplet, based on whether it is "known" or "unknown". Table III illustrates this concept:

TABLE III

| FIRST SYMBOL | SECOND SYMBOL | CONSTELLATION POINT | LLR MAGNITUDE |
|---|---|---|---|
| 01 | 01 | X0X | ZERO, HIGH, ZERO |
| 11 | 01 | 1XX | HIGH, ZERO, ZERO |
| 01 | 11 | 0XX | HIGH, ZERO, ZERO |
| 11 | 11 | X1X | ZERO, HIGH, ZERO |

These unsure bits may also be treated as erasures, with their LLR magnitude values set to ZERO.

Figure 9E:
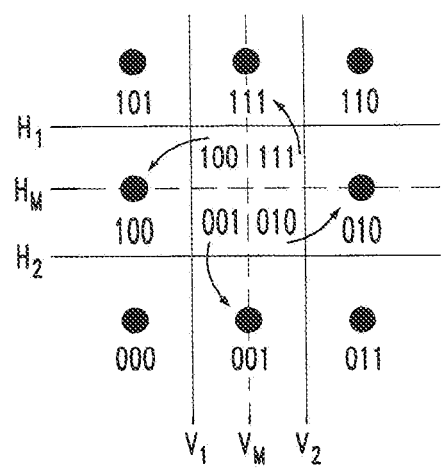
FIG. 9 contains a sequence of several two-dimensional constellations associated with the determination of LLR magnitudes for PAM3 mapping, with FIG. 9(a) illustrating PAM3 hard-input boundary locations along both symbol axes.
FIG. 9(b) illustrating the relationship between PAM4 demapped bits and PAM3 constellation points.
FIG. 9(c) is shaded to illustrate a set of PAM3 constellation points associated with two possible sets of demapped bits.

Alternatively, instead of adding erasures, each entry in the central region can be mapped to a designated one of the closest neighbors (in a one-to-one arrangement), as shown in FIG. 9(e). Again, a low LLR magnitude can be used for these less reliable constellation point mappings. Table IV is a presentation of this specific mapping as shown in FIG. 9(e), with the understanding that other one-to-one mappings to neighbors may also be used.

TABLE IV

| FIRST SYMBOL | SECOND SYMBOL | CONSTELLATION POINT | LLR MAGNITUDE |
|---|---|---|---|
| 01 | 01 | 001 | LOW, HIGH, LOW |
| 11 | 01 | 100 | HIGH. LOW. LOW |
| 01 | 11 | 010 | HIGH, LOW. LOW |
| 11 | 11 | 111 | LOW, HIGH, LOW |

Figure 10:
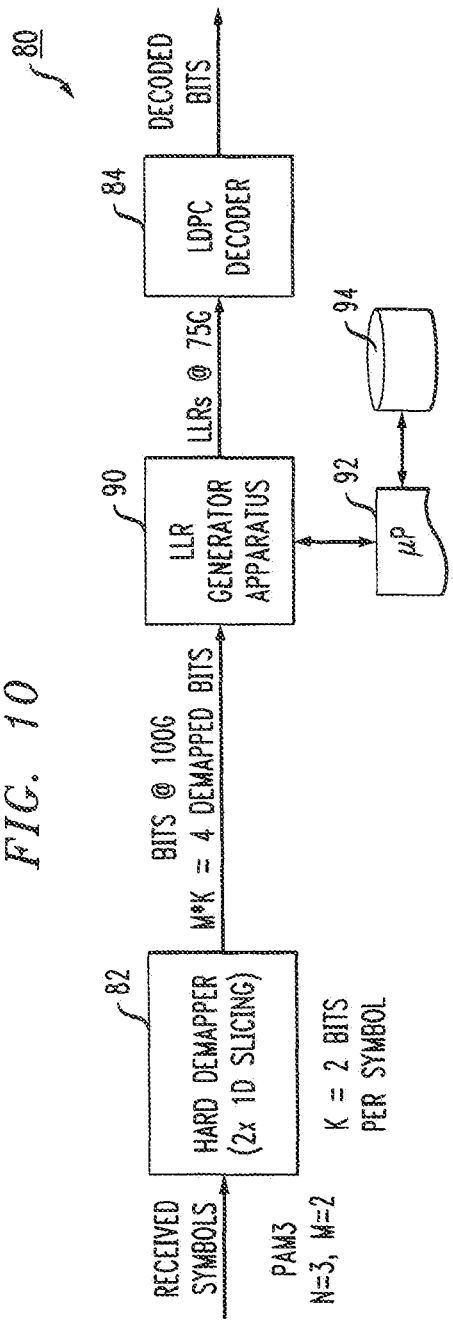
FIG. 10 depicts an exemplary PAM3 receiver that uses the demapping process as outlined in FIG. 9.

FIG. 10 illustrates an exemplary PAM3 receiver structure 80 based on the use of a one-dimensional demapper 82 that is used to demap each incoming symbol into a pair of bits, as described above. In this case, a pair of consecutive symbols are applied as parallel inputs to an LLR generator apparatus 90. Similar to LLR generator apparatus 20 described above, apparatus 90 includes at least one processor 92 and at least one memory 94 including computer program code. Also stored in memory 94 is a set of pre-defined LLR magnitudes (e.g., "HIGH", "ZERO", "LOW", etc.), which are selected by processor 92 to be used in the formation of LLRs for each bit of the set of four bits received by apparatus 90. In particular, memory 94 and its associated computer program code are configured with processor 92 to cause LLR generator apparatus 90 to implement the logic as depicted in the above-described tables to assign appropriate LLR magnitudes to each symbol bit. In this way, LLR generator apparatus 90 provides an output of LLRs at a rate of 75 G LLRs/s for a 100 Gb/s incoming bit stream.

In this PAM3 example, each output from LLR generator apparatus 90 is a triplet of LLRs (associated with the set of three bits defining a PAM3 symbol), which is thereafter applied as the input LLR value to a conventional LDPC decoder 84. As with the PAM4 embodiment, LDPC decoder 84 is used to provide as an output of PAM3 receiver structure 80 the recovered, original data stream.

Beyond the PAM4 and PAM3 specific embodiments, the inventive concept of using one-dimensional hard demapping in combination with multiple LLR magnitudes may be used in recovering data from other two-dimensional constellations, as well as higher-order constellations. Generally, in each case it is possible to create sets of one-dimensional hard demappings from an original 2D constellation by using well-defined boundaries where possible, and introducing modified LLR magnitudes for those regions where a higher level of uncertainty in the constellation is present (e.g., locations with erasures or presumptions of recovered bit values). In summary, the digital receiver configuration can be generalized by considering a scenario where N bits are being transmitted over M symbols. A one-dimensional hard demapper is constrained to generate K=ceil(N/M) bits per symbol, with a bit-to-LLR conversion as performed by the LLR generator apparatus using different LLR magnitudes as a function of the certainty of the individual bits.

Figure 12:
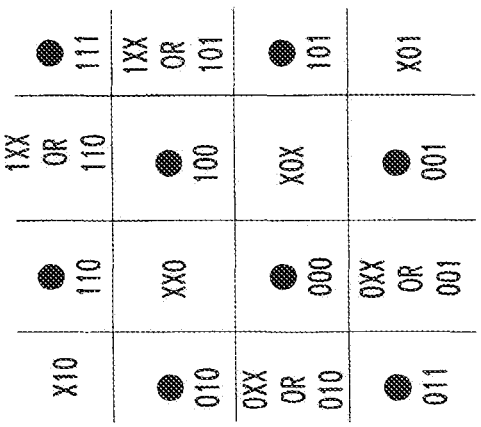
FIG. 12 shows a possible reorganization of the decision thresholds of FIG. 11 that allows for one-dimensional demapping, followed by the generation of appropriate LLR magnitude values for a DSQ8 optical receiver.
Figure 11:
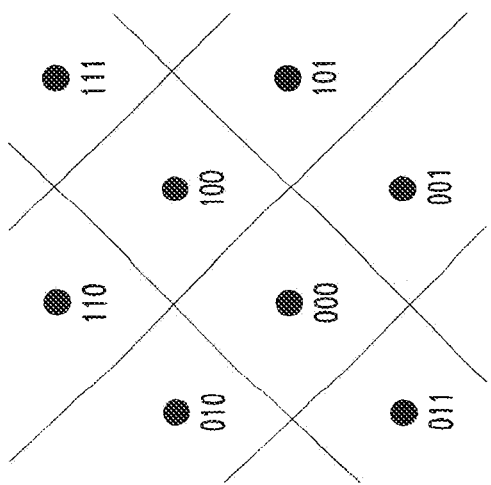
FIG. 11 contains a conventional two-dimensional constellation diagram of yet another non-integer mapping scheme (i.e., an 8-level double-square QAM (DSQ8) scheme), showing the optimal decision thresholds for two-dimensional demapping.

FIGS. 11 and 12 illustrate this generalization by way of DSQ8 mapping, where FIG. 11 shows a conventional two-dimensional constellation (requiring two-dimensional demapping) and FIG. 12 shows a re-creation in an arrangement that may be used with one-dimensional demapping. In general, a DSQ8 constellation consists of two-dimensional PAM4 constellations, of which only half of the constellation points are selected and organized into a double square. Similar to PAM3, DSQ8 provides the transmission of N=3 bits over M=2 symbols. One-dimensional hard demapping with a PAM4 receiver (K=2) can be performed by assigning the different regions to bits or erasures (and thus classifying the initial LLRs), as shown in FIG. 12.

The described examples focus on constellations in which all of the constellation points (and, equivalently, all of the transmitted bits) are transmitted with equal occurrences or probabilities. It is to be understood that the inventive technique also applies to constellation points, and transmitted bits, that are transmitted with unequal probabilities; for instance, when applying probabilistic constellation shaping. In this case, the LLR magnitudes may be derived by also taking into account the prior probabilities with which the bits are being transmitted.

It should be appreciated by those of ordinary skill in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

What is claimed is:

1. A digital receiver for recovering data from a FEC-encoded signal having a stream of N bits mapped into M transmitted symbols, comprising
    a one-dimensional hard demapper for generating a set of K demapped bits for each arriving symbol, where K=ceil(N/M); and
    a FEC decoder for producing a stream of decoded data bits from the output of the one-dimensional hard demapper, the FEC decoder including
        an apparatus responsive to a set of M*K demapped bits including at least a most-significant bit (MSB) and a least-significant bit (LSB), the apparatus configured to convert the set of M*K demapped bits into a plurality of N log-likelihood ratios (LLRs) associated with the stream of N bits in a one-to-one relationship, the apparatus comprising
at least one processor, and
at least one memory including computer program code, wherein the at least one memory and the computer program code are configured, with the at least one processor, to cause the apparatus to generate the plurality of N LLRs, each LLR defined by a magnitude and a sign, the magnitude selected from a plurality of predefined, different LLR magnitudes based on at least probability characteristics associated within a bit-specific ordering within the set of M*K demapped bits from the MSB to the LSB, the magnitude of the MSB being greater than at least the magnitude of the LSB; and
a decoding engine responsive to the LLRs generated by the apparatus and producing therefrom an output stream of decoded data bits.

2. The digital receiver as defined in claim 1 wherein the decoding engine comprises an LDPC decoder.

3. The digital receiver as defined in claim 1 wherein the decoding engine performs one or more iterations to produce the output stream, including a step of updating LLR magnitudes for at least some of the iterations.

4. The digital receiver as defined in claim 1 wherein the decoding engine performs one or more iterations to produce the output stream, each iteration using as an input the plurality of N LLRs generated by the apparatus.

5. The digital receiver as defined in claim 1 wherein the mapping is such that the quantity N/M defines an integer value.

6. The digital receiver as defined in claim 5 wherein the mapping comprises a PAM4 scheme, with N=2 and M=1, the one-dimensional hard demapper generating a set of K=2 demapped bits $b_n$, defined as a (MSB, LSB) pair.

7. The digital receiver as defined in claim 6, wherein the at least one memory stores a set of at least two LLR magnitudes A and B, with A>B, and wherein the at least one processor and the at least one memory including computer program code are configured, to cause the apparatus to at least select LLR magnitude values ($|LLR_{init}|$) from the applied K demapped bits $b_n$ based upon the following:

if $b_n$ is $MSB, |LLR_{init}|=|A| \Rightarrow LLR_n = -1^{b_n}|A|$;

if $b_n$ is $LSB, |LLR_{init}|=|B| \Rightarrow LLR_n = -1^{b_n}|B|$.

8. The digital receiver as defined in claim 6, wherein the at least memory stores a set of at least three LLR magnitudes A1, A2, and A3, where A1>A2>A3, and wherein the at least one memory including computer program code are configured, with the at least one processor, to cause the apparatus to at least generate N LLR magnitude values from the applied K demapped bits $b_n$ based upon the following:

if $b_n$ is $MSB$ and $LSB=0, |LLR_{init}|=|A1|$, and $LLR_n = -1^{b_n}|A1|$;

if $b_n$ is $MSB$ and $LSB=1, |LLR_{init}|=|A2|$, and $LLR_n = -1^{b_n}|A2|$; and if $b_n$ is $LSB, |LLR_{init}|=|A3|$, and $LLR_n = -1^{b_n}|A3|$.

9. The digital receiver as defined in claim 1 wherein characteristics of a communication channel used to transmit the M symbols are used in combination with the bit-specific ordering by the at least one processor and the at least one memory including computer program code to select LLR magnitudes from the plurality of predefined, different LLR magnitudes.

10. The digital receiver as defined in claim 9 wherein an additive white Gaussian noise (AWGN) model of the communication channel is used in the creation of the plurality of predefined, different LLR magnitudes.

11. The digital receiver as defined in claim 9 wherein a set of histograms measured along the communication channel is used in the creation of the plurality of predefined, different LLR magnitudes.

12. The digital receiver as defined in claim 1 wherein the mapping is such that the quantity N/M defines a non-integer value.

13. The digital receiver as defined in claim 12 wherein the mapping comprises a scheme using N=3 and M=2, the one-dimensional hard demapper generating a set of K=ceil (N/M)=2 demapped bits for each symbol, and the apparatus of the FEC decoder using K*M=4 demapped bits to generate the plurality of N LLRs.

14. The digital receiver as defined in claim 13 wherein the mapping scheme is selected from a group consisting of PAM3 mapping and DSQ8 mapping.

15. The digital received as defined in claim 12 wherein the plurality of predefined, different LLR magnitudes includes a magnitude value of "zero".

16. The digital receiver as defined in claim 12 wherein the combination of the at least one processor and at least one memory including computer program code causes the apparatus to generate the plurality of N LLRs by evaluating a selected demapped region of a two-dimensional constellation and determining a most likely constellation point from which any samples in the selected demapped region originate.

17. The digital receiver as defined in claim 1 wherein the digital receiver is configured as a downstream receiver within an optical network unit (ONU) for receiving an incoming optical data stream from an associated optical line terminal (OLT), where the ONU and OLT are associated with a passive optical network (PON).

18. The digital receiver as defined in claim 1 wherein the digital receiver is configured as an upstream receiver within an optical line terminal (OLT) for receiving an incoming optical data stream from an associated optical network unit (ONU), where the OLT and ONU are associated with a passive optical network (PON).

* * * * *